(12) United States Patent
Lee et al.

(10) Patent No.: US 9,406,733 B2
(45) Date of Patent: Aug. 2, 2016

(54) PIXEL STRUCTURE

(71) Applicant: Au Optronics Corporation, Hsinchu (TW)

(72) Inventors: Yi-Hsuan Lee, Taipei (TW); Peng-Bo Xi, Taipei (TW); Wei-Chu Hsu, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/973,758

(22) Filed: Dec. 18, 2015

(65) Prior Publication Data

US 2016/0104753 A1 Apr. 14, 2016

Related U.S. Application Data

(62) Division of application No. 14/447,620, filed on Jul. 31, 2014, now Pat. No. 9,263,509.

(30) Foreign Application Priority Data

Sep. 12, 2013 (TW) .............................. 102133040 A

(51) Int. Cl.
*H01L 27/32* (2006.01)
*H01L 51/52* (2006.01)

(52) U.S. Cl.
CPC ........ *H01L 27/3246* (2013.01); *H01L 27/3248* (2013.01); *H01L 51/5212* (2013.01); *H01L 51/5221* (2013.01)

(58) Field of Classification Search
CPC ............ H01L 27/3246; H01L 27/3248; H01L 51/5212; H01L 51/5221
See application file for complete search history.

(56) References Cited

U.S. PATENT DOCUMENTS

| | | | | |
|---|---|---|---|---|
| 7,855,503 B2 * | 12/2010 | Suh | .................... | G02F 1/136286 257/72 |
| 7,919,918 B2 * | 4/2011 | Kim | ...................... | H01L 27/3244 313/506 |
| 8,318,521 B2 * | 11/2012 | Bang | .................... | H01L 51/5234 257/E21.414 |
| 9,224,870 B2 * | 12/2015 | Yamazaki | ........... | H01L 27/1214 |
| 2005/0179374 A1 * | 8/2005 | Kwak | ................. | H01L 27/3276 313/506 |
| 2006/0027838 A1 * | 2/2006 | Koo | ..................... | H01L 27/3262 257/257 |
| 2006/0267491 A1 * | 11/2006 | Koo | ..................... | H01L 27/3276 313/511 |
| 2007/0001945 A1 * | 1/2007 | Yoshida | ............... | G09G 3/3233 345/87 |
| 2008/0158137 A1 * | 7/2008 | Yoshida | ............... | G09G 3/3413 345/102 |
| 2010/0026167 A1 * | 2/2010 | Park | .................... | H01L 27/3253 313/504 |
| 2010/0148163 A1 * | 6/2010 | Im | ........................ | G06F 3/0412 257/40 |
| 2012/0194412 A1 * | 8/2012 | Kimura | ................ | G09G 3/3241 345/76 |

* cited by examiner

*Primary Examiner* — Ida M Soward
(74) *Attorney, Agent, or Firm* — Jianq Chyun IP Office

(57) ABSTRACT

A pixel structure, including a data line, a scan line, at least one active device, a first auxiliary electrode, and a light emitting device, is provided. The at least one active device is electrically connected with the data line and the scan line, and each active device includes a gate, a channel layer, a source, and a drain. The first auxiliary electrode is electrically insulated from the active device. The light emitting device is disposed above the first auxiliary electrode, wherein the light emitting device includes a first electrode layer, a light emitting layer, and a second electrode layer. The first electrode layer is electrically connected with the first auxiliary electrode. The light emitting layer is disposed on the first electrode layer. The second electrode layer is disposed on the light emitting layer, wherein the second electrode layer is electrically connected with the active device.

5 Claims, 4 Drawing Sheets

PIXEL STRUCTURE

CROSS-REFERENCE TO RELATED APPLICATION

This application is a divisional application of U.S. application Ser. No. 14/447,620, filed on Jul. 31, 2014, now allowed. The prior U.S. application Ser. No. 14/447,620 claims the priority benefit of Taiwan application serial no. 102133040, filed on Sep. 12, 2013. The entirety of each of the above-mentioned patent applications is hereby incorporated by reference herein and made a part of this specification.

BACKGROUND OF THE INVENTION

1. Field of the Invention

The invention relates to a pixel structure and particularly relates to a pixel structure capable of improving the overall luminous uniformity of a display panel.

2. Description of Related Art

An electroluminescent device is a self-emissive device, which has the following characteristics: no limit to the viewing angle, low production cost, high response speed (about hundred times faster than liquid crystal), power saving, suitable for DC driven portable machines, large working temperature range, light weight, suitable for being miniaturized/thinned depending on the hardware equipment, and so on. Therefore, electroluminescent devices have great potential and may very likely become the next-generation flat panel display.

At present, top emission display is one of the display technologies that are extensively applied to electroluminescent devices for improving the pixel aperture ratio. However, the traditional top emission display technology still faces problems, such as difficulty in fabricating thin electrodes, low transmittance, high electrode resistance, and serious IR drop that occurs on large-sized electroluminescent devices. In addition, according to the traditional circuit design of top emission display technology, the current may be easily affected by decline of elements of the electroluminescent devices. Since the luminance of each pixel of the electroluminescent device is related to the current that flows through the pixel, the overall luminous uniformity of the electroluminescent device is low.

SUMMARY OF THE INVENTION

The invention provides a pixel structure for solving the problem of poor overall luminous uniformity that occurs on the traditional electroluminescent device.

The invention provides a pixel structure, which includes a data line, a scan line, at least one active device, a first auxiliary electrode, and a light emitting device. The at least one active device is electrically connected with the data line and the scan line. Each active device includes a gate, a channel layer, a source, and a drain. The first auxiliary electrode is electrically insulated from the active device. The light emitting device is disposed above the first auxiliary electrode, wherein the light emitting device includes a first electrode layer, a light emitting layer, and a second electrode layer. The first electrode layer is electrically connected with the first auxiliary electrode. The light emitting layer is disposed on the first electrode layer. The second electrode layer is disposed on the light emitting layer, wherein the second electrode layer is electrically connected with the active device.

The invention further provides a pixel structure, which includes a data line, a scan line, at least one active device, a light emitting device, and an auxiliary electrode. The at least one active device is electrically connected with the data line and the scan line. The light emitting device is electrically connected with the active device, wherein the light emitting device includes a first electrode layer, a light emitting layer, and a second electrode layer. The light emitting layer is disposed on the first electrode layer. The second electrode layer is disposed on the light emitting layer, wherein the second electrode layer is electrically connected with the active device. The auxiliary electrode is electrically insulated from the active device and located at a side of the light emitting device, wherein the auxiliary electrode is electrically connected with the first electrode layer of the light emitting device.

Based on the above, in the pixel structure of the invention, the first electrode layer of the light emitting device is electrically connected with the auxiliary electrode. Therefore, the design of the invention that coordinates the first electrode layer of the light emitting device with the auxiliary electrode decreases the resistance of the first electrode layer through parallel connection, so as to significantly reduce the total resistance of the pixel structure, thereby improving the overall luminous uniformity of the display panel.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
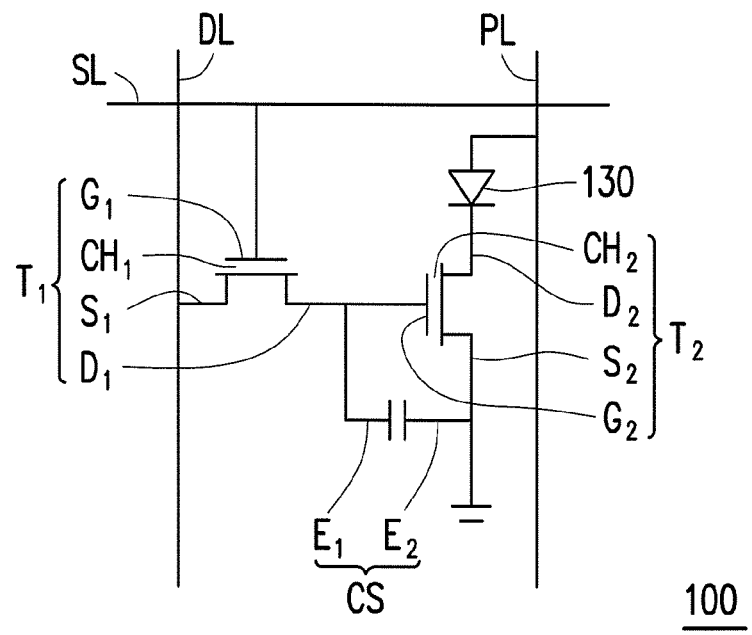
FIG. 1 is an equivalent circuit diagram of a pixel structure of the invention.

FIG. 1 is an equivalent circuit diagram of a pixel structure of the invention. The pixel structure of the invention is applicable to a pixel array of an electroluminescent device, for example. In the following descriptions, one single pixel structure is exemplified to explain in detail the design of the pixel structure of the invention. It should be clear to those having ordinary knowledge in the art that the pixel array of the electroluminescent device is composed of a plurality of identical or similar pixel structures. Therefore, based on the following descriptions of one single pixel structure, those having ordinary knowledge in the art would be able to understand the structure or layout of the pixel array in the electroluminescent device.

With reference to FIG. 1, a pixel structure 100 includes a data line DL, a scan line SL, at least one active device $T_1$ and $T_2$, a capacitor CS, a power line PL, and a light emitting device 130. In this embodiment, each pixel structure 100 for example has two active devices coordinated with one capacitor (2T1C); however, the invention is not limited thereto. This disclosure is not intended to limit the number of the active devices and the number of the capacitors in each pixel structure 100 of the invention.

In this embodiment, the active device $T_1$ is electrically connected with the data line DL and the scan line SL. The active device $T_2$ is electrically connected with the active device $T_1$ and the light emitting device 130. The light emitting device 130 is electrically connected with the active device $T_2$ and the power line PL. Moreover, the capacitor CS is electrically connected with the active devices $T_1$ and $T_2$.

To be more specific, in the pixel structure with 2T1C, the active device T includes a gate $G_1$, a source $S_1$, a drain $D_1$, and a channel layer $CH_1$. The source $S_1$ is electrically connected with the data line DL. The gate $G_1$ is electrically connected with the scan line SL. The drain $D_1$ is electrically connected with the active device $T_2$. The active device $T_2$ includes a gate $G_2$, a source $S_2$, a drain $D_2$, and a channel layer $CH_2$. The gate $G_2$ of the active device $T_2$ is electrically connected with the drain $D_1$ of the active devices $T_1$. The drain $D_2$ of the active device $T_2$ is electrically connected with the light emitting device 130. Moreover, the light emitting device 130 is electrically connected with the drain $D_2$ of the active device $T_2$ and the power line PL. An electrode end $E_1$ of the capacitor CS is electrically connected with the drain $D_1$ of the active device $T_1$ and the gate $G_2$ of the active device $T_2$. The other electrode end $E_2$ of the capacitor CS is electrically connected with the source $S_2$ of the active device $T_2$ and connected to a ground voltage.

Figure 2:
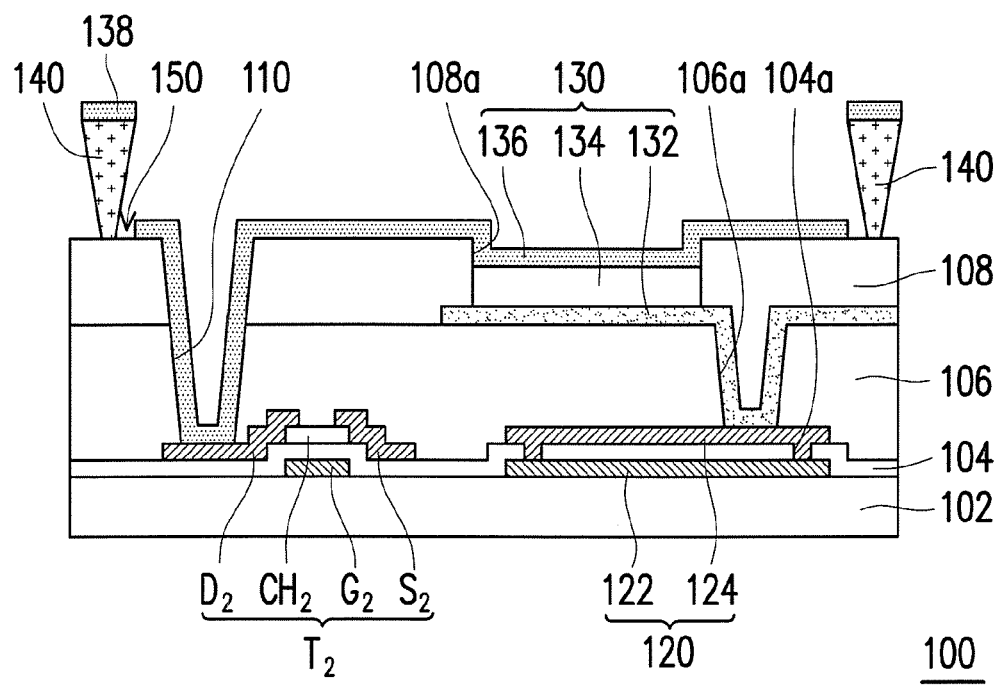
FIG. 2 is a schematic cross-sectional view of a pixel structure according to the first embodiment of the invention.

FIG. 2 is a schematic cross-sectional view of a pixel structure according to the first embodiment of the invention. In order to clearly illustrate this embodiment of the invention, FIG. 2 depicts only a part of the components, such as the active device $T_2$ and the light emitting device 130 of the pixel structure 100. That is to say, for illustrative purpose, the data line DL, the scan line SL, the active device $T_1$, the capacitor CS, the power line PL, and so on are omitted from FIG. 2. Since structures of these omitted components are commonly known to those having ordinary knowledge in the art, details thereof will not be repeated hereinafter.

Referring to FIG. 2, the pixel structure 100 includes a substrate 102, the active device $T_2$, a first auxiliary electrode 120, a first insulating layer 106, a second insulating layer 108, the light emitting device 103, and a first isolating structure 140.

A material of the substrate 102 is glass, quartz, an organic polymer, or a metal, etc., for example.

The active device $T_2$ includes the gate $G_2$, the channel layer $CH_2$, the source $S_2$, and the drain $D_2$. The channel layer $CH_2$ is located above the gate $G_2$ and under the source $S_2$ and the drain $D_2$. In this embodiment, the active device $T_2$ is a bottom gate thin film transistor, for example, but the invention is not limited thereto. In other embodiments, the active device $T_2$ can also be a top gate thin film transistor, and a material of the channel layer $CH_2$ can be an amorphous thin film or a polycrystalline thin film; however, the invention is not limited thereto. In addition, the gate $G_2$ of the active device $T_2$ further has an insulating layer 104 covering thereon, which is also called a gate insulating layer. A material of the insulating layer 104 is an inorganic material, an organic material, or a combination of the foregoing, for example. The inorganic material includes silicon oxide, silicon nitride, silicon oxynitride, or a stack layer of at least two of the foregoing. Moreover, the active device $T_2$ further includes an etch-stop layer (not shown). The etch-stop layer is disposed on the channel layer $CH_2$, and the source $S_2$ and the drain $D_2$ are disposed on the etch-stop layer. A material of the etch-stop layer includes silicon oxide, silicon nitride, silicon oxynitride, or other suitable materials.

The first auxiliary electrode 120 is electrically insulated from the active devices $T_1$ and $T_2$. The first auxiliary electrode 120 includes a bottom electrode layer 122 and a top electrode layer 124. The bottom electrode layer 122 and the gate $G_2$ of the active device $T_2$ belong to the same layer, for example. The top electrode layer 124 and the source $S_2$ and the drain $D_2$ of the active device $T_2$ belong to the same layer, for example. Therefore, the insulating layer 104 is located between the bottom electrode layer 122 and the top electrode layer 124. Furthermore, the insulating layer 104 has a contact window opening 104a that exposes the bottom electrode layer 122. The top electrode layer 124 is filled in the contact window opening 104a, so that the top electrode layer 124 and the bottom electrode layer 122 are electrically connected with each other.

It is worth mentioning that, because the first auxiliary electrode 120 has the bottom electrode layer 122 and the top electrode layer 124, the design of the dual-layer auxiliary electrode helps to maintain the flatness of the pixel structure 100.

The first insulating layer 106 covers the active device $T_2$ and the first auxiliary electrode 120. A material of the first insulating layer 106 is an inorganic material, an organic material, or a combination of the foregoing, for example. The inorganic material includes silicon oxide, silicon nitride, silicon oxynitride, or a stack layer of at least two of the foregoing. In addition, the first insulating layer 106 has a first contact window opening 106a that exposes the top electrode layer 124 of the first auxiliary electrode 120.

The light emitting device 130 is located above the first auxiliary electrode 120. The light emitting device 130 includes a first electrode layer 132, a light emitting layer 134, and a second electrode layer 136. In this embodiment, the light emitting device 130 is a top-emission organic electroluminescent device, for example. Therefore, the first electrode layer 132 and the second electrode layer 136 serve as an anode and a cathode respectively.

The first electrode layer 132 of the light emitting device 130 is disposed on the first insulating layer 106. A material of the first electrode layer 132 is aluminum, ITO, or other materials that are suitable as an anode.

It should be noted that the first electrode layer 132 and the first auxiliary electrode 120 are electrically connected with each other. To be more specific, the first electrode layer 132 of the light emitting device 130 is electrically connected with the top electrode layer 124 of the first auxiliary electrode 120. The first electrode layer 132 is filled in the first contact window opening 106a of the first insulating layer 106, so that the first electrode layer 132 is electrically connected with the top electrode layer 124 of the first auxiliary electrode 120 via the first contact window opening 106a.

The second insulating layer 108 covers the first insulating layer 106 and the first electrode layer 132 of the light emitting device 130. A material of the second insulating layer 108 is an inorganic material, an organic material, or a combination of the foregoing, for example. The inorganic material includes silicon oxide, silicon nitride, silicon oxynitride, or a stack layer of at least two of the foregoing. In addition, the second insulating layer 108 has an opening 108a that exposes the first electrode layer 132. Moreover, the first insulating layer 106 and the second insulating layer 108 further have a second contact window opening 110 therein, which exposes a portion of the active device $T_2$. More specifically, the second contact window opening 110 exposes a portion of the drain $D_2$ the active device $T_2$.

The light emitting layer 134 of the light emitting device 130 is disposed in the opening 108a of the second insulating layer 108, and the light emitting layer 134 is disposed on the first electrode layer 132. Moreover, a vertical projection of the light emitting layer 134 of the light emitting device 130 at least partially overlaps the first auxiliary electrode 120. The light emitting layer 134 can be an organic light emitting layer or an inorganic light emitting layer. According to the material used by the light emitting layer 134, the electroluminescent device is called an organic electroluminescent device or an inorganic electroluminescent device. In addition, the light emitting layer 134 of the light emitting device 130 of each pixel structure 100 can be a red organic light emitting pattern, a green organic light emitting pattern, a blue organic light emitting pattern, or a light emitting pattern of different colors (e.g. white, orange, purple, ... etc.) generated by mixing light of each spectrum. Besides, according to other embodiments, the light emitting layer 134 of the aforementioned light emitting device 130 can further include an electron input layer, a hole input layer, an electron transmission layer, and a hole transmission layer, etc.

The second electrode layer 136 of the light emitting device 130 is located on the second insulating layer 108 and is filled in the opening 108a of the second insulating layer 108 and disposed on the light emitting layer 134. A material of the second electrode layer 136 is silver, thin silver, or other materials that are suitable as a cathode, for example. The second electrode layer 136 is electrically connected with the active device $T_2$. More specifically, the second electrode layer 136 is filled in the second contact window opening 110, so that the second electrode layer 136 of the light emitting device 130 is electrically connected with the drain $D_2$ the active device $T_2$ via the second contact window opening 110.

The first isolating structure 140 is located around the second electrode layer 136 of the light emitting device 130, wherein a first gap 150 exists between the second electrode layer 136 and the first isolating structure 140. A material of the first isolating structure 140 is a photoresist or other suitable materials, for example. Besides, a shape of the first isolating structure 140 is an inverted triangle, for example. Therefore, a method of forming the first gap 150 includes depositing a second electrode layer material (not shown) on the second insulating layer 108 and the first isolating structure 140, and using the inverted-triangular first isolating structure 140 to break apart the second electrode layer material. As a result, the first gap 150 is formed around a bottom portion of the first isolating structure 140, so as to separate the second electrode layer 136 and the first isolating structure 140. Moreover, the electrode layer 138 is formed on the first isolating structure 140, and the electrode layer 138 and the second electrode layer 136 belong to the same layer.

It should be noted that, because the second electrode layer 136 of the light emitting device 130 is formed by the breaking-apart of the inverted-triangular first isolating structure 140, the second electrode layer 136 having a thinner thickness can be formed by a simplified fabrication process, so that the pixel structure 100 has higher transmittance and the second electrode layer 136 has lower resistance, and so on, thereby improving the problem of IR drop.

Also, it is worth mentioning that, because the first electrode layer 132 and the first auxiliary electrode 120 are electrically connected, the design of the invention, that coordinates the first electrode layer 132 of the light emitting device 130 with the auxiliary electrode, can reduce the resistance of the first electrode layer 132 through parallel connection, so as to reduce the total resistance of the pixel structure 100 by about 40%, thereby improving the overall luminous uniformity of the display panel. For example, the design of coordinating the aforementioned electrode layer with the auxiliary electrode is applicable to the anode of the top-emission organic electroluminescent device, so as to reduce the resistance of the anode through parallel connection. However, the invention is not limited thereto. In other embodiments, the design of coordinating the aforementioned electrode layer with the auxiliary electrode is also applicable to other suitable electrode layers or conductive layers.

Figure 3:
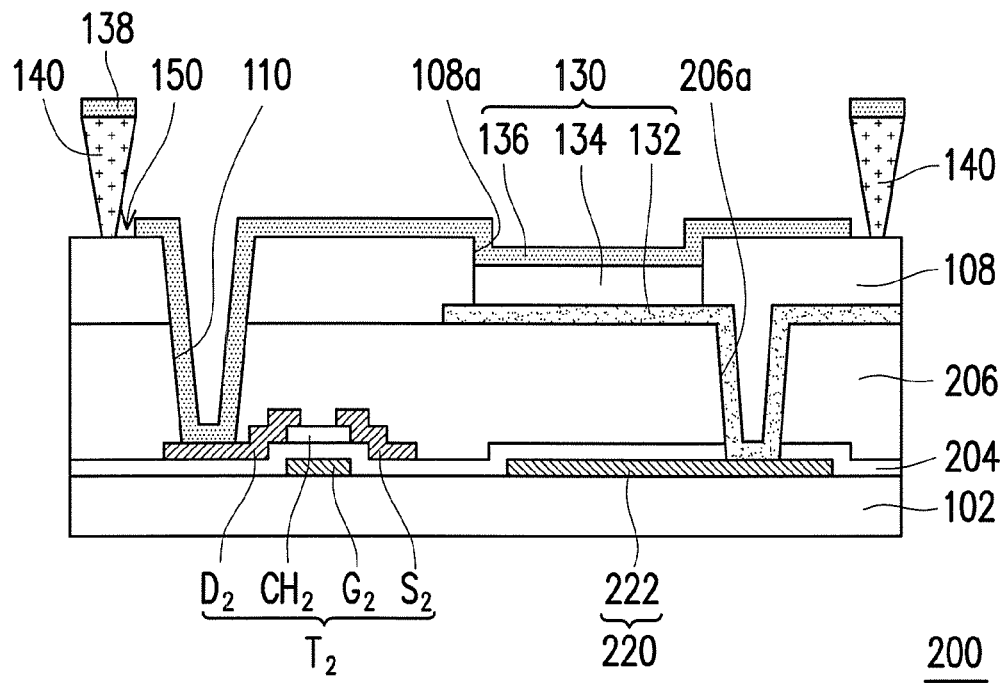
FIG. 3 is a schematic cross-sectional view of a pixel structure according to the second embodiment of the invention.
Figure 4:
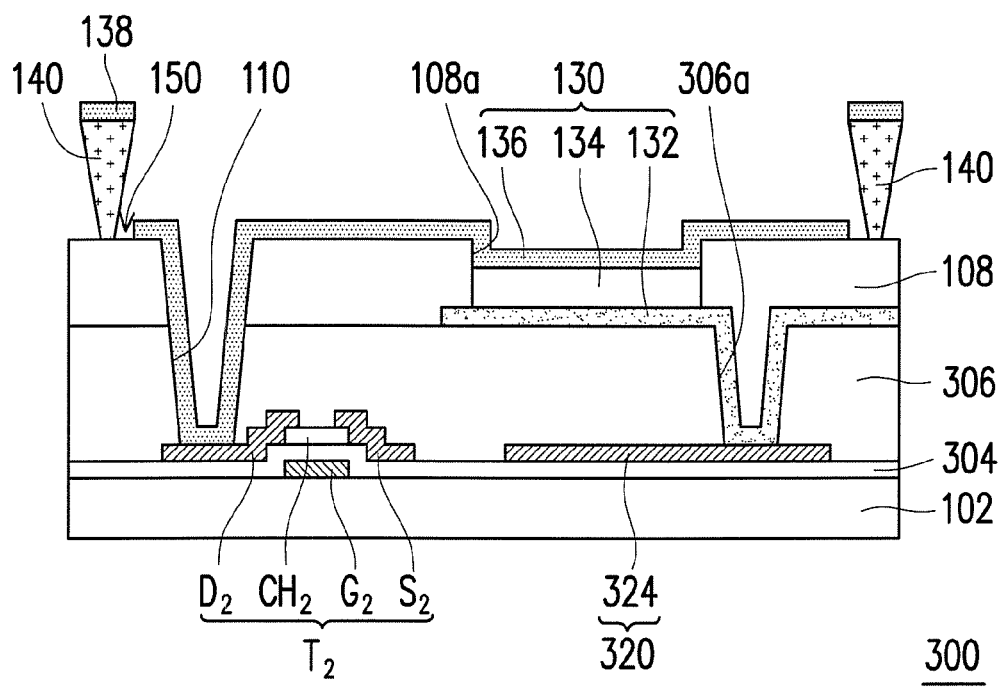
FIG. 4 is a schematic cross-sectional view of a pixel structure according to the third embodiment of the invention.

In the embodiment of FIG. 2, the first auxiliary electrode 120 is a dual-layer electrode layer; however, the invention is not limited thereto. In other embodiments of the invention (as shown in FIG. 3 and FIG. 4), the first auxiliary electrode can also be a single electrode layer. Here, the single electrode layer is not necessarily an electrode layer with one layer, and the single electrode layer may also refer to an electrode layer having a multi-film stack structure.

FIG. 3 and FIG. 4 are schematic cross-sectional views of pixel structures according to the second and third embodiments of the invention. The embodiments of FIG. 3 and FIG. 4 are similar to the embodiment of FIG. 2. The identical or similar components are assigned with the same or similar reference numerals, and detailed descriptions thereof will not be repeated hereinafter.

With reference to FIG. 3, a difference between the embodiment of FIG. 3 and the embodiment of FIG. 2 lies in that, in a pixel structure 200, a first auxiliary electrode 220 merely includes a bottom electrode layer 222, and the bottom electrode layer 222 and the gate $G_2$ of the active device $T_2$ belong to the same layer, for example. Therefore, an insulating layer 204 covers the bottom electrode layer 222. Besides, the insulating layer 204 and a first insulating layer 206 further include a first contact window opening 206a that exposes the bottom electrode layer 222. The first electrode layer 132 is filled in the first contact window opening 206a of the insulating layer 204 and the first insulating layer 206, so that the first electrode layer 132 is electrically connected with the bottom electrode layer 222 of the first auxiliary electrode 220 via the first contact window opening 206a.

With reference to FIG. 4, a difference between the embodiment of FIG. 4 and the embodiment of FIG. 2 lies in that, in a pixel structure 300, a first auxiliary electrode 320 merely includes a top electrode layer 324, and the top electrode layer 324 and the source $S_2$ and the drain $D_2$ of the active device $T_2$ belong to the same layer, for example. Therefore, the top electrode layer 324 is located above an insulating layer 304. Moreover, a first insulating layer 306 has a first contact window opening 306a that exposes the top electrode layer 324 of the first auxiliary electrode 320. The first electrode layer 132 is filled in the first contact window opening 306a of the first insulating layer 306, so that the first electrode layer 132 is electrically connected with the top electrode layer 324 of the first auxiliary electrode 320 via the first contact window opening 306a.

Figure 5:
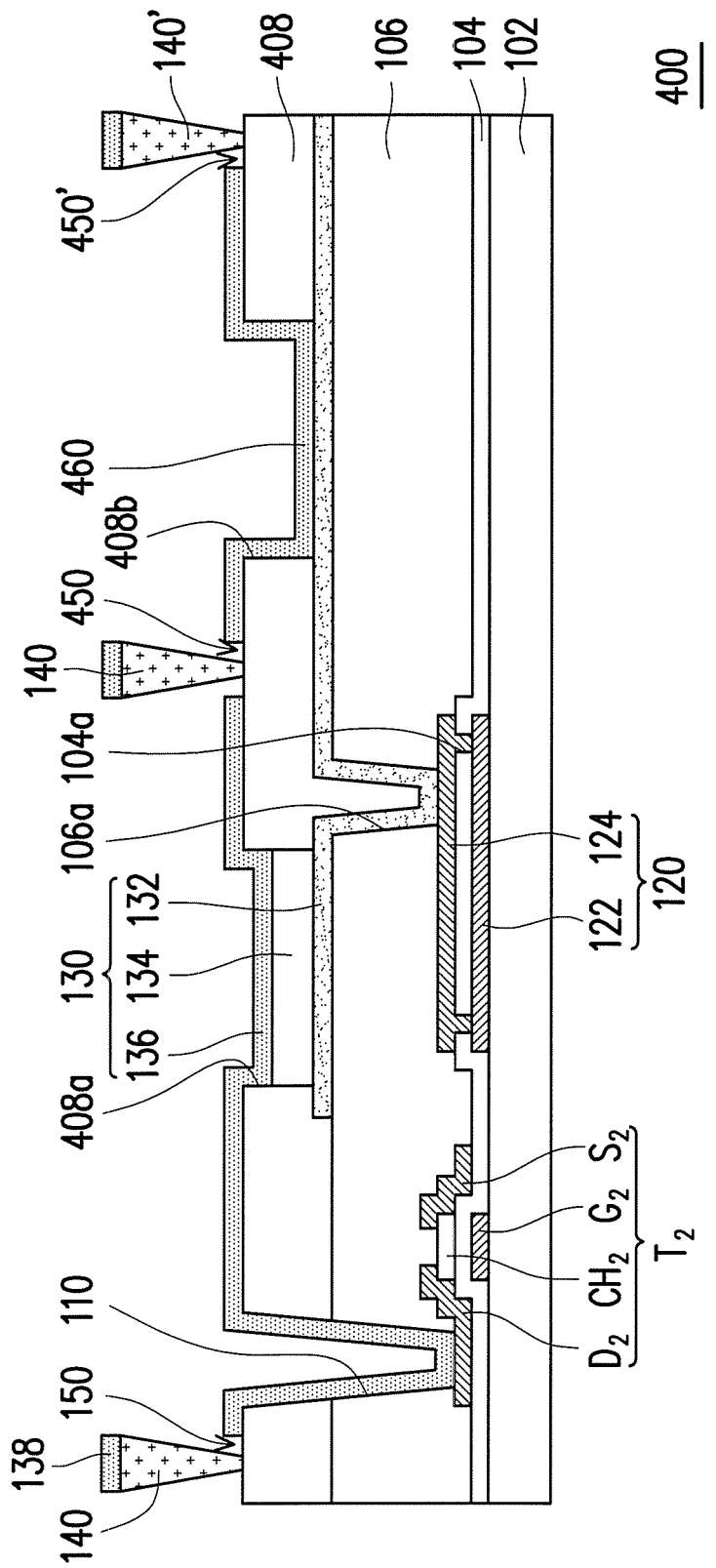
FIG. 5 is a schematic cross-sectional view of a pixel structure according to the fourth embodiment of the invention.

FIG. 5 is a schematic cross-sectional view of a pixel structure according to the fourth embodiment of the invention. The embodiment of FIG. 5 is similar to the embodiment of FIG. 2. Therefore, the identical or similar components are assigned with the same or similar reference numerals, and detailed descriptions thereof will not be repeated hereinafter. A difference between the embodiment of FIG. 5 and the embodiment of FIG. 2 is that a pixel structure 400 further includes a second auxiliary electrode 460.

With reference to FIG. 5, the second auxiliary electrode 460 is electrically insulated from the active device $T_2$ and located at a side of the light emitting device 130, wherein the second auxiliary electrode 460 is electrically connected with the first electrode layer 132 of the light emitting device 130. To be more specific, a second insulating layer 408 has an opening 408a and a contact window opening 408b that expose the first electrode layer 132. The light emitting layer 134 of the light emitting device 130 is disposed in the opening 408a of the second insulating layer 408. The second auxiliary electrode 460 is filled in the contact window opening 408b of the second insulating layer 408, so that the second auxiliary electrode 460 is electrically connected with the first electrode layer 132 of the light emitting device 130 via the contact window opening 408b.

In addition, the second auxiliary electrode 460 and the second electrode layer 136 of the light emitting device 130 belong to the same layer, for example, and the second auxiliary electrode 460 and the second electrode layer 136 of the light emitting device 130 are electrically insulated from each other. More specifically, the pixel structure 400 further includes a second isolating structure 140' that is located at a side of the first isolating structure 140, wherein the second auxiliary electrode 460 is disposed between the first isolating structure 140 and the second isolating structure 140'. A second gap 450 exists between the second auxiliary electrode 460 and the first isolating structure 140, and a second gap 450' exists between the second auxiliary electrode 460 and the second isolating structure 140'. Therefore, the second auxiliary electrode 460 and the first isolating structure 140 are electrically insulated from each other, and the second auxiliary electrode 460 and the second isolating structure 140' are electrically insulated from each other. In addition, the second isolating structure 140' and the first isolating structure 140 belong to the same layer, for example.

It should be noted that, because a metal that has lower sheet resistance and higher electric conductivity can be used in the second electrode layer 136 of the light emitting device 130 and the second auxiliary electrode 460, the resistance of the second electrode layer 136 can be reduced more effectively to improve the problem of IR drop.

Also, it is worth mentioning that the first electrode layer 132 is electrically connected with the first auxiliary electrode 120 and the second auxiliary electrode 460. Therefore, the design of the invention that coordinates the first electrode layer 132 of the light emitting device 130 with two auxiliary electrodes decreases the resistance of the first electrode layer 132 through parallel connection, so as to reduce the total resistance of the pixel structure 400 by about 90%, thereby improving the overall luminous uniformity of the display panel. For example, the design of coordinating the aforementioned electrode layer with two auxiliary electrodes is applicable to the anode of the top-emission organic electroluminescent device, so as to reduce the resistance of the anode through parallel connection. However, the invention is not limited thereto. In other embodiments, the design of coordinating the aforementioned electrode layer with two auxiliary electrodes is also applicable to other suitable electrode layers or conductive layers.

Figure 6:
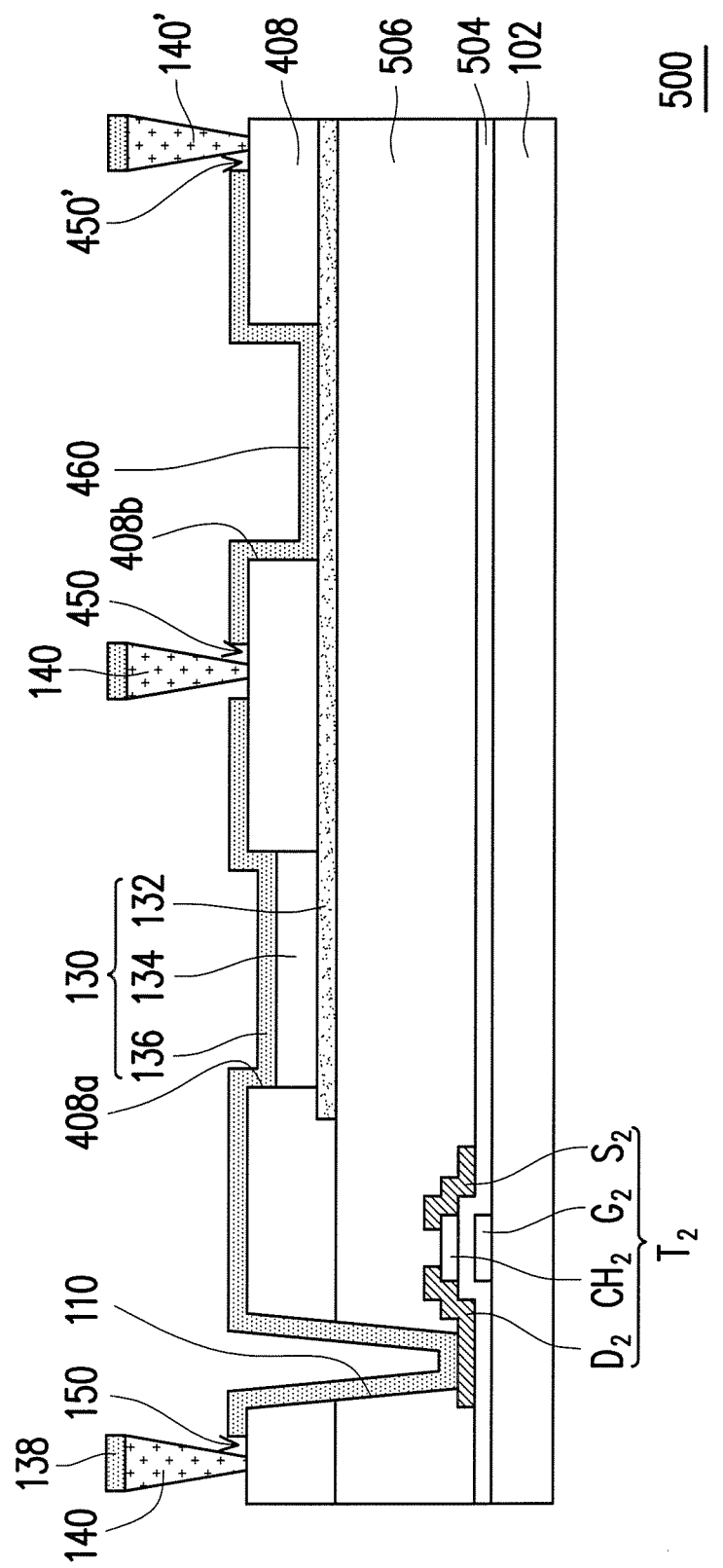
FIG. 6 is a schematic cross-sectional view of a pixel structure according to the fifth embodiment of the invention.

FIG. 6 is a schematic cross-sectional view of a pixel structure according to the fifth embodiment of the invention. The embodiment of FIG. 6 is similar to the embodiment of FIG. 5. Therefore, the identical or similar components are assigned with the same or similar reference numerals, and detailed descriptions thereof will not be repeated hereinafter. A difference between the embodiment of FIG. 6 and the embodiment of FIG. 5 lies in that a pixel structure 500 merely includes the second auxiliary electrode 460 and does not include the first auxiliary electrode 120.

With reference to FIG. 6, the second auxiliary electrode 460 is electrically insulated from the active device $T_2$ and located at a side of the light emitting device 130, wherein the second auxiliary electrode 460 is electrically connected with the first electrode layer 132 of the light emitting device 130. Moreover, an insulating layer 504 covers the gate $G_2$ of the active device $T_2$ and the substrate 102. A first insulating layer 506 covers the active device $T_2$ and the insulating layer 504. The first electrode layer 132 of the light emitting device 130 is located on the first insulating layer 506.

In conclusion of the above, in the pixel structure of the invention, the first electrode layer of the light emitting device is electrically connected with the first auxiliary electrode or the second auxiliary electrode or both, wherein the first auxiliary electrode and the gate of the active device belong to the same layer, or the first auxiliary electrode and the source and the drain belong to the same layer, or has the dual-layer electrode structure. Meanwhile, the second auxiliary electrode and the second electrode layer belong to the same layer. Therefore, without increasing the number of masks and production costs, the design of the invention that coordinates the first electrode layer of the light emitting device with the auxiliary electrodes decreases the resistance of the first electrode layer through parallel connection, so as to significantly reduce the total resistance of the pixel structure, thereby improving the overall luminous uniformity of the display panel. In addition, the circuit design of the top emission display technology of the invention also prevents decline of devices of the electroluminescent device from affecting the current.

It will be apparent to those having ordinary knowledge in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A pixel structure, comprising:
   a data line and a scan line;
   at least one active device electrically connected with the data line and the scan line;
   a light emitting device electrically connected with the active device, wherein the light emitting device comprises:
   a first electrode layer;
   a light emitting layer disposed on the first electrode layer; and
   a second electrode layer disposed on the light emitting layer, wherein the second electrode layer is electrically connected with the active device; and
   an auxiliary electrode electrically insulated from the active device and disposed at a side of the light emitting device, wherein the auxiliary electrode is electrically connected with the first electrode layer of the light emitting device.

2. The pixel structure according to claim 1, further comprising:
   a first insulating layer covering the active device, and the first electrode layer of the light emitting device being disposed on the first insulating layer;
   a second insulating layer covering the first insulating layer and the first electrode layer of the light emitting device, and the second electrode layer of the light emitting device being disposed on the second insulating layer, wherein the second insulating layer has an opening and a first contact window opening that expose the first electrode layer, and the light emitting layer of the light emitting device is disposed in the opening and the auxiliary electrode is electrically connected with the first electrode layer via the first contact window opening.

3. The pixel structure according to claim 2, wherein the first insulating layer and the second insulating layer further comprise a second contact window opening that exposes a portion of the active device, and the second electrode layer of the light emitting device is electrically connected with the active device via the second contact window opening.

4. The pixel structure according to claim 1, further comprising:
- a first isolating structure disposed around the second electrode layer of the light emitting device, wherein a first gap exists between the second electrode layer and the first isolating structure; and
- a second isolating structure disposed at a side of the first isolating structure, wherein the auxiliary electrode is disposed between the first isolating structure and the second isolating structure, and the auxiliary electrode is electrically insulated from the first isolating structure and the auxiliary electrode is electrically insulated from the second isolating structure.

5. The pixel structure according to claim 1, wherein the auxiliary electrode and the second electrode layer of the light emitting device belong to the same layer, and the auxiliary electrode is electrically insulated from the second electrode layer of the light emitting device.

* * * * *